(12) United States Patent
Rimondi

(10) Patent No.: US 6,212,094 B1
(45) Date of Patent: Apr. 3, 2001

(54) LOW POWER SRAM MEMORY CELL HAVING A SINGLE BIT LINE

(75) Inventor: Danilo Rimondi, Mozzo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/200,075

(22) Filed: Nov. 25, 1998

(30) Foreign Application Priority Data

Nov. 28, 1997 (EP) ................................................ 97 120944

(51) Int. Cl.[7] .................................................... G11C 11/00
(52) U.S. Cl. ............................................. 365/156; 365/154
(58) Field of Search ................................... 365/156, 154, 365/203, 69

(56) References Cited

U.S. PATENT DOCUMENTS

| | | | |
|---|---|---|---|
| 5,276,652 | 1/1994 | Anami | 365/227 |
| 5,353,251 | 10/1994 | Uratani et al. | 365/189.05 |
| 5,850,364 | * 12/1998 | Ueno | 365/203 |
| 5,966,319 | * 10/1999 | Sato | 365/154 |
| 5,986,923 | * 11/1999 | Zhang et al. | 365/154 |
| 6,005,795 | * 12/1999 | Hawkins et al. | 365/156 |
| 6,011,711 | * 1/2000 | Hodges et al. | 365/154 |

FOREIGN PATENT DOCUMENTS 4128919    3/1992  (DE) .

OTHER PUBLICATIONS

Patent Abstract of Japanese publication No. 61026997, published Feb. 6, 1986.
European Search Report dated May 13, 1998 with annex on European Application No. 97 120944.

* cited by examiner

Primary Examiner—Richard Elms
Assistant Examiner—Anh Phung
(74) Attorney, Agent, or Firm—Theodore E. Galanthay; Stephen C. Bongini; Fleit, Kain, Gibbons, Gutman & Bongini P.L.

(57) ABSTRACT

A semiconductor memory cell having a word line, a bit line, a precharge line, an access transistor, and first and second cross-coupled inverters. The first inverter includes a first P-channel transistor and a first N-channel transistor, and the second inverter includes a second P-channel transistor and a second N-channel transistor. The access transistor selectively couples the bit line to an output of the first or second inverter, and one terminal of the first N-channel transistor is connected to the precharge line. In a preferred embodiment, a control circuit is provided that, during a writing operation, supplies data to be written to the memory cell to the bit line, supplies a pulse signal to the precharge line, and activates the word line. A method of writing data to a semiconductor memory cell that is coupled to a word line and single bit line is also provided. According to the method, the level of the bit line is set in accordance with data to be written, the memory cell is precharged so as to force the output of one of the inverters of the memory cell to a predetermined logic level, and the word line is activated to couple the bit line to the memory cell.

19 Claims, 3 Drawing Sheets

LOW POWER SRAM MEMORY CELL HAVING A SINGLE BIT LINE

CROSS-REFERENCE TO RELATED APPLICATIONS

This application is based upon and claims priority from prior European Patent Application No. 97-120944.0, filed Nov. 28, 1997, the entire disclosure of which is herein incorporated by reference.

BACKGROUND OF THE INVENTION

1. Field of the Invention

The present invention relates to semiconductor memory devices, and more specifically to a low power SRAM memory cell with cross-coupled CMOS inverters coupled to a single bit line.

2. Description of the Related Art

A conventional semiconductor static random access memory (SRAM) device is formed with static memory cells that each have six transistors. FIG. 1 shows a conventional CMOS six transistor SRAM memory cell. The memory cell 1 includes a pair of cross-coupled CMOS inverters 2 and 3, each of which is coupled to a bit line 4 and 5. In particular, the first inverter 2 is coupled to a first bit line 4 through a bi-directional access device 6, and the second inverter 3 is coupled to an adjacent second bit line 5 through a second access device 7. During reading and writing operations, different voltages must be applied to the two bit lines 4 and 5. Thus, this type of access to the storage node of the memory cell can be termed "differential."

More specifically, during reading from the memory cell of FIG. 1, the bit line voltage swing amplitude is dependent upon the length of time the memory cell has been activated. The voltage difference caused by the swing can be kept quite small and sensed by the sense amplifier of the memory device in order to reduce power consumption. Further, during writing to the memory cell, the bit line voltage swing is made as large as possible (e.g., the full CMOS logic voltage level) in order to toggle (i.e., write to) the memory cell. Thus, in an SRAM six transistor memory cell array with m rows and n columns, the current consumption during reading and writing can be estimated using the following formulas:

$$Idd_r = n*m*Cb*\Delta V_r \quad (1)$$

$$Idd_w = m*m*Cb*\Delta V_w \quad (2)$$

where n is the number of bits in the word being read or written, Cb is the bit line capacitance associated with a given cell, $\Delta V_r$ is the bit line voltage swing during a read operation, and $\Delta V_w$ is the bit line voltage swing during a write operation. Typically, $\Delta V_w$ corresponds to the supply voltage level Vdd.

Previous efforts to reduce the power consumed by such a memory matrix focus on changing one or more of the parameters in the above formulas. One such technique is disclosed by N. Kushiyama et al. in "A 295 MHz CMOS 1M (x256) embedded SRAM using I-directional read/write shared sense amplifiers and self-timed pulsed word-line drivers" (ISSCC Dig. Tech. Papers, February 1995, pages 182–183). According to this technique, power consumption is reduced by reducing the number of cells on the bit line through a hierarchical bit line scheme.

Another power reduction technique is disclosed by B. Amrutur and H. Horowitz in "Technique to reduce power in fast wide memories" (Dig. Tech. Papers, October 1994, Symp. on Low Power Electronics, pages 92–93). This technique reduces power consumption by limiting the bit line voltage swing during a read by controlling the word line pulse length. Yet another power reduction technique is disclosed by T. Blalock and R. Jager in "A high-speed clamped bit line current-mode sense amplifier" (IEEE J. Solid State Circuits, Vol. 26, No. 4, April 1991, pages 542–548). This solution also reduces power consumption by limiting the bit line voltage swing during a read, but does so using current-mode sense amplifiers so as to reduce $\Delta V_r$. Still another power reduction technique limits the bit line voltage swing during a write to a predetermined value (i.e., Vdd-Vt) using NMOS transistors during precharging.

Further efforts at reducing power consumption have focused on reducing the current consumption by coupling each memory cell to a single bit line instead of the conventional bit line pair. In such devices, the lower bit line capacitance presented by the single bit line cells decreases current consumption. For example, in "A single-bit-line cross-point cell activation (SCPA) architecture for ultra-low-power SRAMs" (IEEE J. Solid State Circuits, Vol. 28, No, 11, November 1992, pages 1114–1118) M. Ukita et al. disclose a single bit line architecture that includes five transistor SRAM cells with a single bit line, as shown in FIG. 2. Moreover, in "A source sensing technique applied to SRAM cells" (IEEE J. Solid State Circuits, Vol. 30, No. 4, April 1995, pages 500–511), K. J. O'Connor addresses the problem of writing to such a single access SRAM cell.

With such single access (i.e., single bit line) SRAM memory cells, whether or not switching occurs during a read operation is dependent upon the data stored in the memory cell being read. Because switching only occurs when one of the two possible logic values is stored in the memory cell, power consumption (over time) is reduced by one half. Similarly, during a writing operation, the bit lines are only discharged when one of the two possible logic values (e.g., "0") is to be written. Thus, the power consumption during writing (over time) is also reduced by half. Although conventional single access SRAM memory cells offer such significant reductions in power consumption, a serious drawback is presented in that it is difficult to write the other non-discharging logic value (e.g., "1") to the memory cells.

More specifically, when writing a high (1) logic level to a memory cell that is storing a low (0) logic level, the node N1 is low and a high level must be written into the memory cell. When the bit line BL is set high and the word line WL is activated, the transistors M5 and M1 fight one another. In order to make the memory cell stable during such an operation, the O'Connor reference teaches dimensioning the transistor M1 so that it is larger than the transistor M5. However, writing remains quite difficult and the proposed transistor dimension solution requires complex techniques that increase the design complexity of the memory device.

SUMMARY OF THE INVENTION

In view of these drawbacks, it is an object of the present invention to remove the above-mentioned drawbacks and to provide an SRAM memory device with reduced power consumption. An SRAM memory device is formed with memory cells that each have cross-coupled inverters coupled to a single bit line. During operation, one terminal of a pull-down transistor of a memory cell is precharged. Thus, the memory cell is precharged to a logic state that can be easily changed during writing.

In other words, the memory cell is "reset" before a writing operation. In one illustrative embodiment in which five transistor SRAM memory cells are used, the precharging logic state is logic "1" and the "reset" operation is performed by applying a pulse signal to the source terminal of one of the driver transistors.

Another object of the present invention is to provide an SRAM memory device that reduces the probability of bit line switching by coupling a single bit line to each memory cell.

A further object of the present invention is to provide an SRAM memory device having a simple write operation.

Yet another object of the present invention is to provide an SRAM memory device that has relatively long word length but reduced power consumption.

One embodiment of the present invention provides a semiconductor memory cell having a word line, a bit line, a precharge line, an access transistor, and first and second cross-coupled inverters. The first inverter includes a first P-channel transistor and a first N-channel transistor, and the second inverter includes a second P-channel transistor and a second N-channel transistor. The access transistor selectively couples the bit line to an output of the first or second inverter, and one terminal of the first N-channel transistor is connected to the precharge line. In a preferred embodiment, a control circuit is provided that, during a writing operation, supplies data to be written to the memory cell to the bit line, supplies a pulse signal to the precharge line, and activates the word line.

Another embodiment of the present invention provides a method of writing data to a semiconductor memory cell that is coupled to a word line and single bit line. According to the method, the level of the bit line is set in accordance with data to be written, the memory cell is precharged so as to force the output of one of the inverters of the memory cell to a predetermined logic level, and the word line is activated to couple the bit line to the memory cell. In one preferred method, the predetermined logic level is a logic level that can be easily changed during writing.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 1:
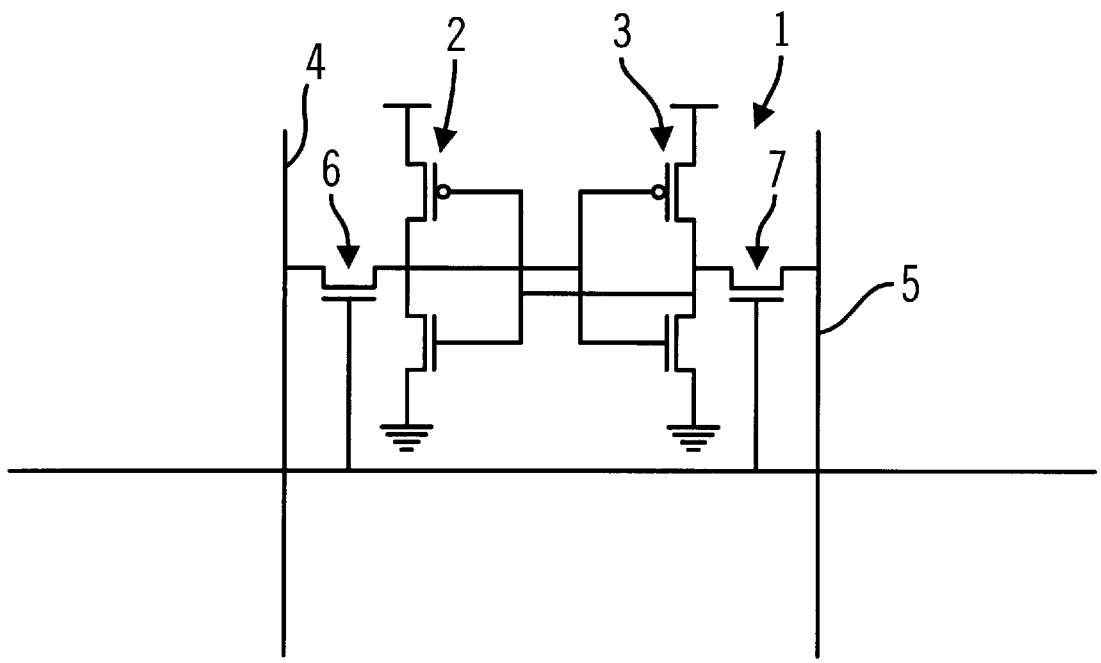
FIG. 1 is a schematic diagram of a conventional double bit line CMOS SRAM memory cell.
Figure 2:
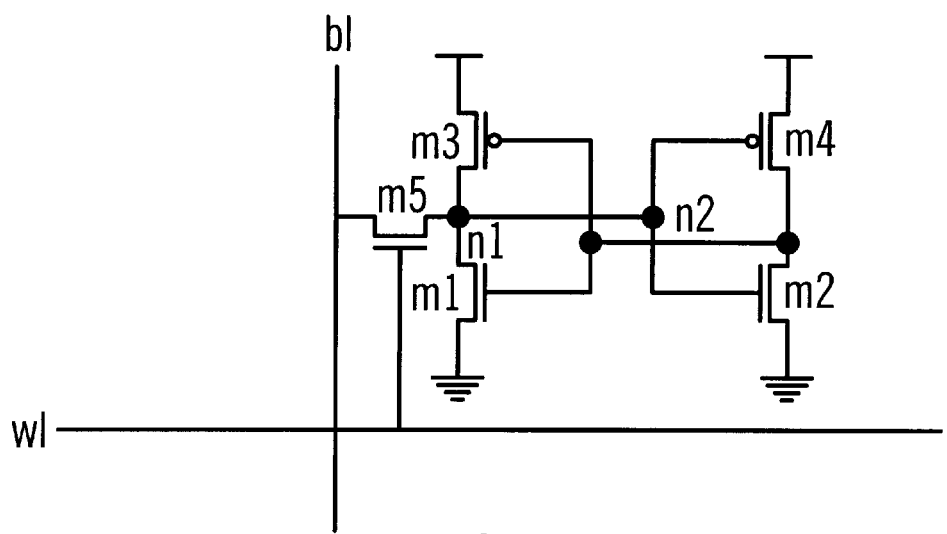
FIG. 2 is a schematic diagram of a conventional single bit line CMOS SRAM memory cell.
Figure 3:
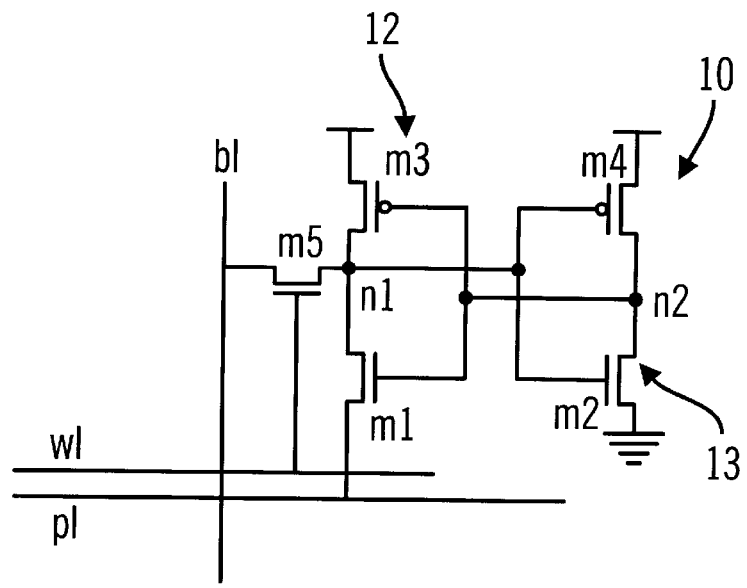
FIG. 3 is a schematic diagram of a memory cell according to a preferred embodiment of the present invention.

FIG. 3 shows a static random access memory (SRAM) cell according to a preferred embodiment of the present invention. The memory cell 10, which is formed using CMOS technology, is designed for a semiconductor SRAM memory device of the type in which each memory cell is coupled to a single bit line BL. In particular, the memory cell 10 of FIG. 3 is integrated into a memory array or matrix that includes m rows and n columns, as partially shown in FIG. 4. Each row is identified with a word line WL and each column is identified with a bit line BL of the memory device. One of the memory cells 10 is located at each intersection of a word line WL and a single bit line BL.

As shown in FIG. 3, the memory cell 10 includes two CMOS inverters 12 and 13 that each have a pull-up PMOS transistor and a pull-down NMOS transistor. The two inverters 12 and 13 are cross-coupled (i.e., for each inverter, the interconnection node for the two transistors of the inverter is connected to the gate terminals of the two transistors of the other inverter). More specifically, the first inverter 12 has a PMOS transistor M3 and an NMOS transistor M1 connected in series, and the second inverter 13 has a PMOS transistor M4 and an NMOS transistor M2 connected in series. The gate terminals of the transistors M1 and M3 of the first inverter 12 are connected to a first node N1, which is the series connection point of the drain terminals of the second inverter 13. Likewise, the gate terminals of the transistors M2 and M4 of the second inverter 13 are connected to a second node N2, which is the series connection point of the drain terminals of the first inverter 12.

Figure 4:
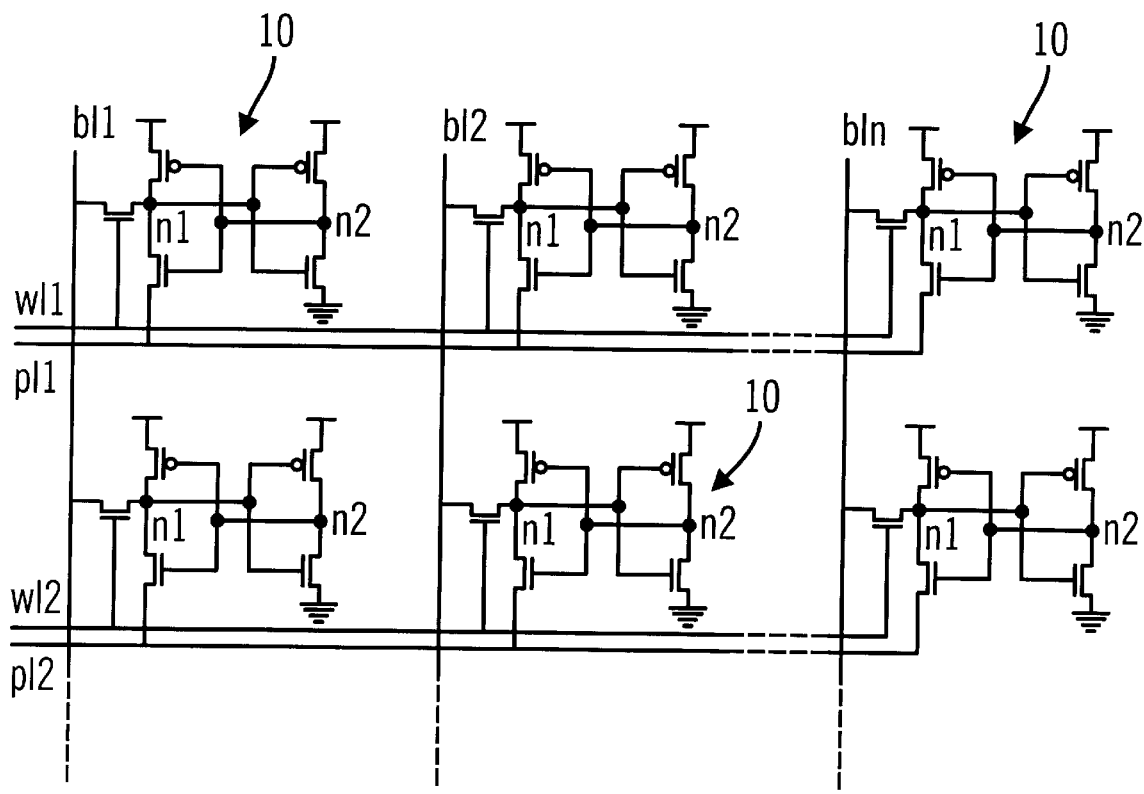
FIG. 4 is a schematic diagram of a portion of a memory array that includes the memory cells of FIG. 3.

The second node N2 is coupled to a bit line BL through an access transistor (e.g., PMOS transistor) M5, and the gate terminal of the access transistor is connected to the word line WL. The source terminals of the two PMOS transistors M3 and M4 are connected to a voltage supply line Vdd. Further, the source terminal of the NMOS transistor M2 of the second inverter 13 is connected to ground GND, and the source terminal of the NMOS transistor M1 of the first inverter 12 is connected to a precharge line PL. The precharge line PL is an added line that is common to all the memory cells 10 in a row. FIG. 4 shows a portion of the structure of a memory matrix that includes such memory cells 10.

During operation of the SRAM memory device of FIG. 4, when a memory cell is not accessed or read from, the corresponding precharge line PL is coupled to ground. This provides the ground potential to the source terminal of the NMOS transistor M1 so that both data retention and read operations are performed in the same manner as in a conventional SRAM memory cell. On the other hand, a memory cell is written to using a three step process.

First, the data to be written to the memory cell is placed on the corresponding bit line (i.e., the levels of the bit lines are set according to the memory word to be written). Next, a pulse is supplied to the corresponding precharge line PL so as to "reset" the first node N1 of each memory cell connected to the precharge line to the high (1) logic level. More specifically, if the first node N1 of a selected memory cell had been at a low (0) logic level, that node is raised to the voltage level Vdd-Vtn by the NMOS transistor M1, and is then raised all the way to the supply voltage level Vdd by the PMOS transistor M3. Then, the word line WL is activated and connected memory cells having a low level bit line are "flipped" to the low logic level. The high level logic states of the remaining memory cells (i.e., those having a high level bit line) are not changed. Thus, a high (1) logic level can be written to a memory cell that is storing a low (0) logic level in a simple and efficient manner.

Figure 5:
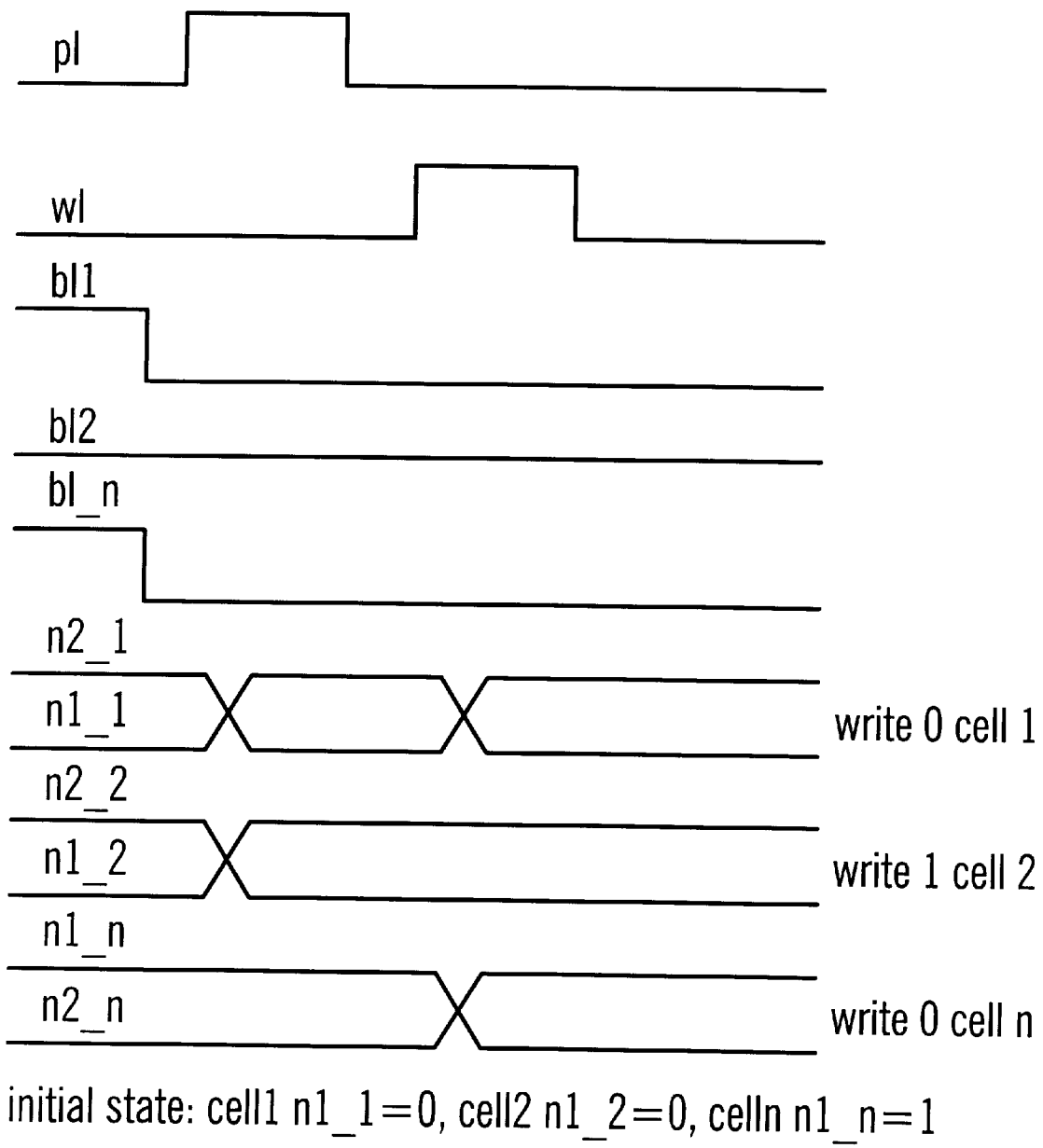
FIG. 5 is a timing diagram for a write operation in the memory cell of FIG. 3.

FIG. 5 is a timing diagrams for such a write operation in the SRAM memory device of FIG. 4. The illustrated write operation relates to the writing of the first, second, and n$^{th}$ memory cells of a memory word.

In another embodiment of the present invention, a six transistor single bit line SRAM memory cell is provided. The sixth transistor M6 is connected between the first node N1 and ground GND, and the gate terminal of the sixth transistor M6 is connected to the precharge line PL. In this embodiment, the sixth transistor operates as an additional access transistor for resetting the first node N1 to the high (1) logic level. This provides the memory cell with greater noise immunity because the "cell ratio" is not altered by the presence of the sixth transistor. Where $W_1$ and $W_6$ are the widths and $L_1$ and $L_6$ are the lengths of the transistors M1 and M6, the cell ratio (r) is defined by the following formula.

$$r=(W_1/L_1)/(W_6/L_6) \qquad (3)$$

As previously explained, the present invention provides an SRAM memory cell formed by cross-coupled inverters coupled to a single bit line. During a write operation, the source terminal of one of the pull-down transistors of the memory cell is precharged in order to reset the memory cell to a predetermined logic state that can be easily changed during writing. Thus, the SRAM memory cell of the present invention allows power consumption to be reduced without introducing significant complexities into the writing process. The present invention is particularly useful for memory devices with very long word lengths.

While there has been illustrated and described what are presently considered to be the preferred embodiments of the present invention, it will be understood by those skilled in the art that various other modifications may be made, and equivalents may be substituted, without departing from the true scope of the invention. Additionally, many modifications may be made to adapt a particular situation to the teachings of the present invention without departing from the central inventive concept described herein. Furthermore, embodiments of the present invention may not include all of the features described above. Therefore, it is intended that the present invention not be limited to the particular embodiments disclosed, but that the invention include all embodiments falling within the scope of the appended claims.

What is claimed is:

1. A semiconductor memory cell comprising:
   a word line;
   a bit line;
   a precharge line;
   first and second cross-coupled inverters, the first inverter including a first P-channel transistor and a first N-channel transistor, and the second inverter including a second P-channel transistor and a second N-channel transistor; and
   an access transistor that selectively couples the bit line to an output of one of the first inverter and the second inverter,
   wherein one terminal of the first N-channel transistor is connected to the precharge line.

2. The semiconductor memory cell as defined in claim 1, wherein the access transistor selectively couples the bit line to the output of the first inverter, and
   the source terminal of the first N-channel transistor of the first inverter is connected to the precharge line.

3. The semiconductor memory cell as defined in claim 1, wherein the gate terminal of the access transistor is connected to the word line.

4. The semiconductor memory cell as defined in claim 1, further comprising a control circuit that supplies a pulse signal to the precharge line during a writing operation for the memory cell.

5. The semiconductor memory cell as defined in claim 1, further comprising a control circuit that, during a writing operation, supplies data to be written to the memory cell to the bit line, supplies a pulse signal to the precharge line, and activates the word line.

6. The semiconductor memory cell as defined in claim 1, wherein the memory cell is a static RAM memory cell.

7. A semiconductor memory cell comprising:
   a word line;
   a bit line;
   a precharge line;
   first and second cross-coupled inverters, the first inverter including a first P-channel transistor and a first N-channel transistor, and the second inverter including a second P-channel transistor and a second N-channel transistor;
   an access transistor that selectively couples the bit line to an output of the first inverter; and
   a precharge transistor connected between the output of the first inverter and a predetermined voltage,
   wherein one terminal of the first N-channel transistor and the gate terminal of the precharge transistor are connected to the precharge line.

8. The semiconductor memory cell as defined in claim 7, wherein the source terminal of the first N-channel transistor of the first inverter is connected to the precharge line.

9. The semiconductor memory cell as defined in claim 7, wherein the gate terminal of the access transistor is connected to the word line.

10. The semiconductor memory cell as defined in claim 7, further comprising a control circuit that supplies a pulse signal to the precharge line during a writing operation for the memory cell.

11. The semiconductor memory cell as defined in claim 7, further comprising a control circuit that, during a writing operation, supplies data to be written to the memory cell to the bit line, supplies a pulse signal to the precharge line, and activates the word line.

12. A semiconductor memory device comprising:
    a plurality of word lines;
    a plurality of bit lines;
    a plurality of precharge lines; and
    a plurality of memory cells coupled to the word lines, bit lines, and precharge lines, each of the memory cells including:
      first and second cross-coupled inverters, the first inverter including a first P-channel transistor and a first N-channel transistor, and the second inverter including a second P-channel transistor and a second N-channel transistor, one terminal of the first N-channel transistor being connected to one of the precharge lines; and
      an access transistor that selectively couples an output of one of the first inverter and the second inverter to one of the bit lines.

13. The semiconductor memory device as defined in claim 12, wherein for each of the memory cells:
    the access transistor selectively couples the one bit line to the output of the first inverter, and
    the source terminal of the first N-channel transistor of the first inverter is connected to the one precharge line.

14. The semiconductor memory device as defined in claim 12, wherein for each of the memory cells, the gate terminal of the access transistor is connected to one of the word lines.

15. The semiconductor memory device as defined in claim 12, further comprising a control circuit that supplies a pulse signal to at least one of the precharge lines during a writing operation for the memory device.

16. The semiconductor memory device as defined in claim 12, further comprising a control circuit that, during a writing operation, supplies data to be written to one of the memory cells to one of the bit lines, supplies a pulse signal to at least one of the precharge lines, and activates at least one of the word lines.

17. The semiconductor memory device as defined in claim 12, wherein the precharge lines run parallel to the word lines.

18. The semiconductor memory device as defined in claim 12, wherein each of the precharge lines is commonly coupled to all of the memory cells that are coupled to one of the word lines.

19. The semiconductor memory device as defined in claim 12, wherein each of the memory cells further includes a precharge transistor connected between the output of the first inverter and a predetermined voltage, the gate terminal of the precharge transistor being connected to one of the precharge lines.

* * * * *